(12) United States Patent
Foo et al.

(10) Patent No.: US 9,978,735 B2
(45) Date of Patent: May 22, 2018

(54) INTERCONNECTION OF AN EMBEDDED DIE

(71) Applicant: Altera Corporation, San Jose, CA (US)

(72) Inventors: Loke Yip Foo, Bayan Baru (MY); Choong Kooi Chee, Georgetown (MY); Mei See Chin, Gelugor (MY); Wai Ling Lee, Bayan Lepas (MY); Wei Lun Oo, Georgetown (MY)

(73) Assignee: Altera Corporation, San Jose, CA (US)

( * ) Notice: Subject to any disclaimer, the term of this patent is extended or adjusted under 35 U.S.C. 154(b) by 0 days. days.

(21) Appl. No.: 15/278,289

(22) Filed: Sep. 28, 2016

(65) Prior Publication Data

US 2018/0090474 A1 Mar. 29, 2018

(51) Int. Cl.
| | |
|---|---|
| *H01L 21/56* | (2006.01) |
| *H01L 25/00* | (2006.01) |
| *H01L 25/065* | (2006.01) |
| *H01L 23/00* | (2006.01) |

(52) U.S. Cl.
CPC .............. *H01L 25/50* (2013.01); *H01L 21/56* (2013.01); *H01L 24/16* (2013.01); *H01L 25/0657* (2013.01); *H01L 2224/13005* (2013.01); *H01L 2224/16145* (2013.01); *H01L 2225/06513* (2013.01); *H01L 2225/06548* (2013.01); *H01L 2225/06568* (2013.01); *H01L 2225/06572* (2013.01)

(58) Field of Classification Search
CPC ... H01L 25/06; H01L 25/065; H01L 25/0657; H01L 25/50; H01L 22/06; H01L 22/13; H01L 22/16; H01L 21/56
USPC ........................................................ 257/737
See application file for complete search history.

(56) References Cited

U.S. PATENT DOCUMENTS

| | | | |
|---|---|---|---|
| 8,227,904 | B2 | 7/2012 | Braunisch et al. |
| 9,396,300 | B2 | 7/2016 | Wang et al. |
| 2013/0277855 | A1* | 10/2013 | Kang ................ H01L 23/49816 257/774 |
| 2014/0191419 | A1 | 7/2014 | Debendra et al. |
| 2015/0255411 | A1 | 9/2015 | Omkar et al. |

FOREIGN PATENT DOCUMENTS

EP 2615639 A2 7/2013

OTHER PUBLICATIONS

PCT International Search Report & Written Opinion for PCT Application No. PCT/US2017/051852 dated Dec. 28, 2017; 14 Pages.

\* cited by examiner

*Primary Examiner* — Monica D Harrison
(74) *Attorney, Agent, or Firm* — Fletcher Yoder, P.C.

(57) ABSTRACT

Devices and methods related to an integrated circuit device are provided. The integrated circuit device includes a mother die and a daughter die, in which the daughter die embedded is in a substrate of the integrated circuit device. Micro bumps of the mother die and the daughter die interface together to form a direct down connection between the mother die and the daughter die.

20 Claims, 4 Drawing Sheets

INTERCONNECTION OF AN EMBEDDED DIE

BACKGROUND

The present disclosure relates generally to integrated circuit devices with one or more embedded die. More particularly, the present disclosure relates to an embedded die that directly connects to another die.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. These ICs are usually formed using a die. A die is a small block of semiconductor material (e.g., silicon) upon which a circuit is located. The circuit on the die may perform a specific function (e.g., operational amplifier) or more general-purpose functions, such as processors or programmable devices [e.g., field programmable gate array, (FPGA)]. One or more die (or dice) may be packaged together in an integrated circuit (IC). The packaged IC provides protection for the one or more die and their circuitry. The packaging may also provide an accessible connection to the one or more die from outside the package and/or provide interconnection between the die. However, these connections to the die and/or between the die may control latency of functions to be performed by the integrated circuit. Specifically, longer connections and lower density of the connections increases latency in those connections. One method of providing such interconnections includes using a through-silicon via (TSV). However, TSVs are costly to fabricate with relatively high levels of technical issues and complexities in implementation during fabrication of the integrated circuit device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for directly connecting mother and daughter die in an integrated circuit (IC) device package. As discussed below, one or more daughter die are embedded in a substrate of the IC device package providing a short, high-density interconnection path between the mother die and each respective die of the one or more daughter die without using a through-silicon via (TSV). Specifically, the mother die and the daughter die may be aligned with their micro bumps facing each other. These micro bumps extend from the mother die and the daughter die to interface with each other to form a direct via down interconnection with a high-density interconnection. The mother and daughter die may be connected through circuitry in the IC device package or through a microvia in a substrate as well.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon referencing the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design of projects/products, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to directly connecting mother and embedded daughter die in an integrated circuit (IC) device package. A mother die may be the die that primarily drives functioning of an IC device package. Additionally or alternatively, the mother die may generally be a die that is physically larger than other die in the IC device package. As discussed below, one or more daughter die are embedded in a substrate of the IC device package providing a short interconnection path between the mother die and the one or more daughter die without using a through-silicon via (TSV). Specifically, the mother die and the daughter die may be aligned with their micro bumps facing each other. These micro bumps extending from the mother die and the daughter die may interface with each other to form a direct via down interconnection with a high-density interconnection.

Since the mother die and a respective daughter die are aligned such that micro bumps interface each other, the mother die and the respective daughter die overlap by some distance. This overlap reduces an overall footprint for the IC device package without reducing functionality and substantially increasing complications in driving the mother die and the respective die.

Since the one or more daughter die are embedded in the substrate, the one or more daughter die may be directly accessed using surface routing on the substrate or in routing in one or more layers of the substrate rather than accessed only through the mother die. This connection scheme reduces complexity of the mother die since the mother die may not be relied upon to provide all power and all communication to the one or more daughter die.

Furthermore, during the overall process of fabrication, since the one or more daughter die are embedded in the substrate, only one chip attach process may be used in some embodiments. Specifically, only the mother die may be connected to the substrate in a chip attach process. Also, the complexity of underfilling the mother die is reduced since only the mother die is underfilled.

Figure 1:
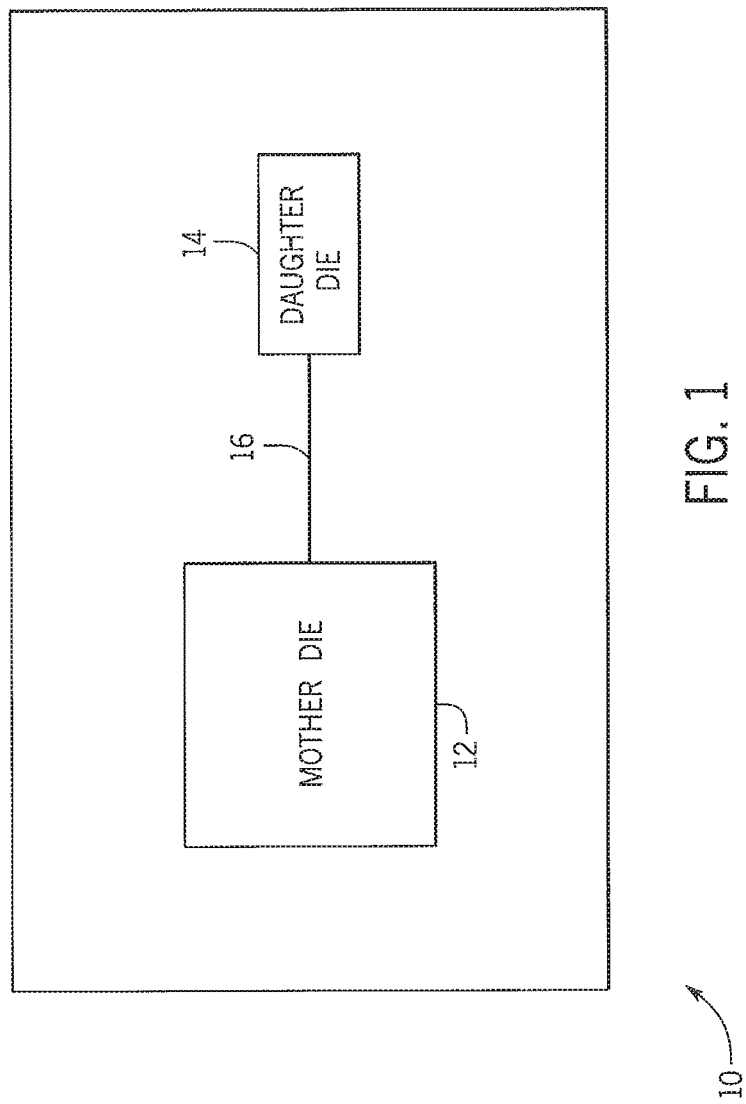
FIG. 1 is a block diagram of an integrated circuit device having multiple die therein, in accordance with an embodiment.

FIG. 1 illustrates an embodiment of an integrated circuit (IC) device 10 that includes a mother die 12 and one or more daughter die 14 that are packaged together in the IC device 10. The mother die 12 may be any circuitry disposable on semiconductor substrates. For example, the mother die 12 may include processing circuitry, such as those found in a central processing unit (CPU) or programmable circuitry. In another example, the mother die 12 may include programmable logic circuitry of a programmable logic device, such as a field programmable gate array (FPGA). Additionally or alternatively, the mother die 12 may include any circuitry that interacts with other circuitry in the one or more daughter die 14. Similarly, the daughter die 14 may include any circuitry (e.g., CPU, FPGA, memory, transceiver, etc.) that interacts with circuitry of the mother die 12. The IC device 10 is then packaged together to protect the circuitry from outside elements or to distribute heat generated by the circuitry of the die 12 and 14. The packaging also facilitates connection to the mother die 12 and the one or more daughter die 14.

Figure 2:
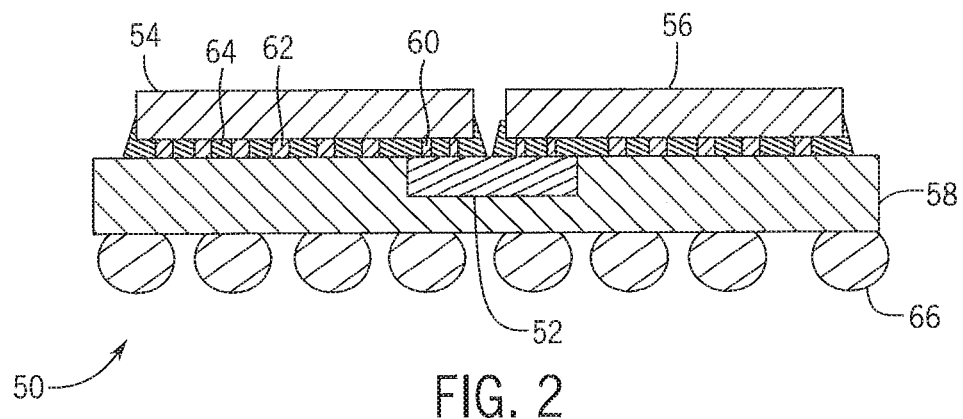
FIG. 2 is a block diagram of an integrated circuit device package with a semiconductor interconnect between adjacent die, in accordance with an embodiment.

FIG. 2 illustrates an integrated circuit (IC) device package 50 that includes an embedded interconnect bridge 52 that connects a mother die 54 and a daughter die 56. The embedded interconnect bridge 52 is embedded in a substrate 58 of the IC device package 50. The die 54 and 56 couple to each other through the interconnect bridge 52 through micro bumps 60. The interconnect bridge 52 enables a high-density connection between the mother die 54 and the daughter die 56 with a lower manufacturing cost or complexity than using a TSV. However, the path through the interconnect bridge 52 is relatively long, thereby complicating interfacing timing closure between the mother die 54 and the daughter die 56. Furthermore, a footprint of the IC device package 50 may be relatively large. Specifically, the footprint of the IC device package 50 is more greatly increased by the mother die 54 and the daughter die 56 being located adjacent to each other along with the size increase contributed by the interconnect bridge 52.

Formation of the IC device package 50 includes separately coupling the mother die 54 and the daughter die 56 to the embedded interconnect bridge 52 in the substrate 58. Each separate coupling of the mother die 54 or the daughter die 56 includes a potential risk that the respective die may not attach properly.

The IC device package 50 includes die bumps 62 that couples the respective die 54 and 56 to the substrate 58. The die 54 and 56 are then underfilled using an underfill 64. The underfill 64 may be an electrically insulating adhesive. The underfill 64 increases mechanical strength of the connection between the substrate 58 and the die 54 and 56. The underfill 64 reduces thermal expansion mismatch between the die 54 and 56 and the substrate 58. The underfill 64 may be dispensed at an edge of the connection and then flowed under the device using capillary action to flow the underfill 64 between the die bumps 62. In the IC device package 50, the underfill 64 is flowed under both the mother die 54 and the daughter die 56. Each underfilling introduces difficulty in the fabrication of the IC device package 50. Furthermore, underfilling both die 54 and 56 in parallel or series may be more complicated than underfilling a single die.

The IC device package 50 includes solder balls 66 that are arranged in a two-dimensional plane to provide interconnection locations for the IC device package 50 to external devices. Each solder ball 66 provides a location to which external connections may be made for input to or output from the circuitry in the IC device package 50.

Figure 3:
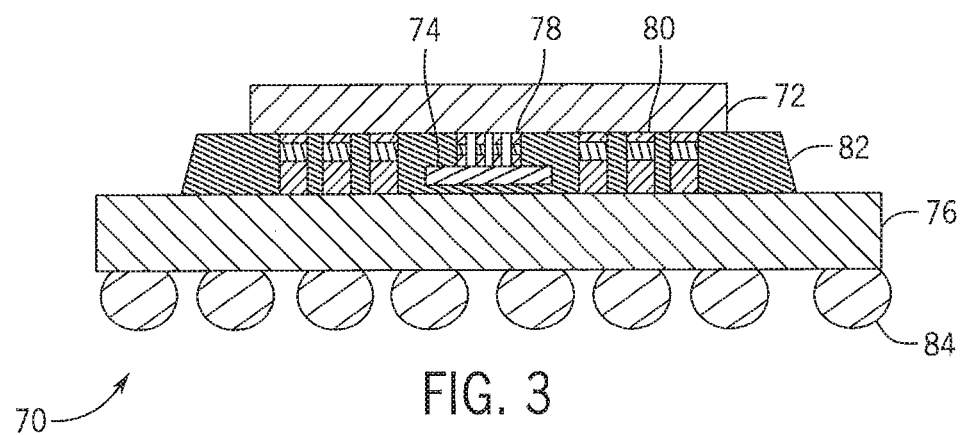
FIG. 3 is a block diagram of an integrated circuit device package with a face-to-face arrangement of stacked die, in accordance with an embodiment.

FIG. 3 illustrates an integrated circuit (IC) device package 70 that includes a mother die 72 and a daughter die 74 oriented in a face-to-face orientation above a substrate 76 of the IC device package 70. Faces of the mother die 72 and the daughter die 74 connect through a direct connection through micro bumps 78. Face-to-face stacking of the mother die 72 and the daughter die 74 enables a direct and short interface distance between the mother die 72 and the daughter die 74. However, all connections to the daughter die 74 go through the mother die 72 via die bumps 80. The IC device package 70 includes underfill 82 that works similarly to the underfill 64 of FIG. 2. The IC device package 70 also includes solder balls 84 similar to the solder balls 66 of FIG. 2.

Although the IC device package 70 uses a short interconnection path between the mother die 72 and the daughter die 74. However, the assembly process is relatively complex and costly. For example, the thermal compression of the IC device package 70 increases another failure point in which the fabrication process can go wrong and increases assembly cost. Also, similar to the IC device package 50, the IC device package 70 includes separate attachments of the mother die 72 and the daughter die 74. The IC device package 70 also includes more potential difficulties and failures than that may occur during the underfilling process of the IC device package 50 discussed previously.

Figure 4:
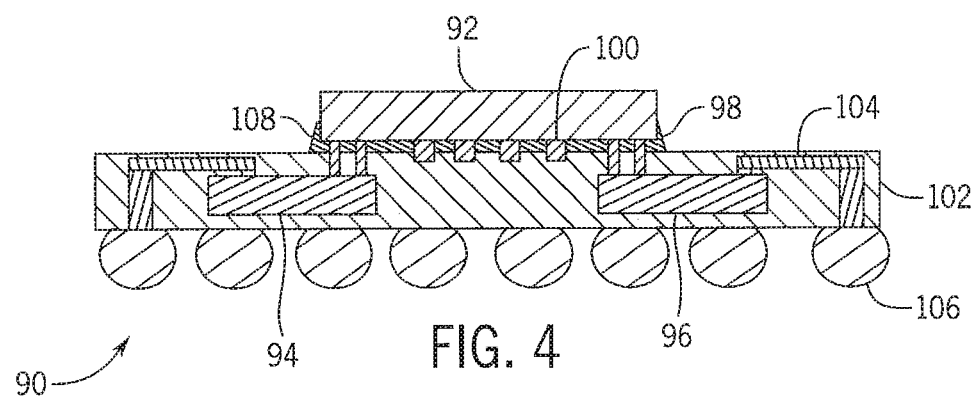
FIG. 4 is a block diagram of an integrated circuit device package with embedded daughter die, in accordance with an embodiment.

FIG. 4 illustrates an integrated circuit (IC) device package 90 that includes a mother die 92 that is coupled to two embedded daughter die 94 and 96. Although only two embedded daughter die 94 are illustrated, the IC device package 90 may include any number of embedded daughter die 94, 96 that are capable of physically interfacing with the mother die 92. Each daughter die 94, 96 is oriented facing the mother die 92. Furthermore, the mother die 92 is aligned with the daughter die 94, 96, such that micro bumps 98 of the mother die 92 and the one or more daughter die 94, 96 interface with each other to form a direct down via from the mother die 92 to the daughter die 94, 96. The direct down connection is a relatively short via that provides a high-density interconnection between the mother die 92 and the daughter die 94, 96. This direct down connection allows high bandwidth communication without increasing complication of closure of a timing interface between the mother die and the daughter die 94, 96. Furthermore, the shortness of the direct down connection may include improved signal integrity over longer interconnection paths.

The mother die 92 also has die bumps 100 that couple the mother die 92 to a substrate 102 through which connections to external circuitry may be made. The daughter die 94, 96 may connect to external circuitry via routing 104. The routing 104 may include layers in the substrate 102 for surface routing that allows a direct bond (e.g., connection) out of the IC device package 90. For example, the routing 104 may couple the daughter die 94, 96 to solder balls 106 that provide an interface through which connection to the daughter die 94, 96 may be made directly. In other words, using the routing 104, the IC device package 90 facilitates direct connection to the daughter die 94, 96 without connecting through the mother die 92. This direct connection may be particularly useful in providing power and ground connections without providing such power through the mother die 92 since such connections through the mother die 92 may utilize an additional redistribution layer and/or increase power consumption of the mother die 92. Furthermore, the IC device package 90 may also provide connectivity to the mother die 92 through the solder balls 106 through the substrate 102. Although the foregoing discussed using solder balls 106 in a ball grid array, in some embodiments, the IC device package 90 may include other packaging types, such as through-hole packaging, surface mounting packaging, chip carrier packaging, pin grid array packaging, grid array packaging, flat packaging, and/or other suitable packaging types.

The IC device package 90 also includes an underfill 108 that functions similarly to the underfills 64 and 82 of FIGS. 2 and 3. However, since the underfill 108 is located only under the mother die 92, the underfill 108 is only flowed under a single die. Since the underfill 108 is only flowed under a single die rather than more than one die, the surface area of the underfill 108 may be smaller and the underfill 108 may be performed faster with less chance of improper application (e.g., improper flow) and/or quality or reliability issues.

Furthermore, as illustrated, the mother die 92 is the only die that undergoes a chip-attach process in which the mother die 92 is attached to the substrate 102. Since only a single die is to be chip attached, the process is simpler than processes that utilize more than a single die attachment process. Furthermore, since only the mother die 92 is attached, there are fewer opportunities for failure of the chip-attach process.

Moreover, the IC device package 90 utilizes a three-dimensional packaging with at least some overlap between the mother die 92 and respective daughter die 94, 96. This overlap reduces overall footprint size of implementation of the IC device package 90 over packages with the same die packages adjacent to each other. Size is an important factor in electronic devices. In an attempt to enable higher system performance by expanding Moore Laws to fit in more transistors within a single chip, three-dimensional packaging may be used to highly integrate systems within a single device. However, since the overlap includes only a portion of the daughter die 94, 96, the daughter die 94, 96 may be directly accessed without complicating connection to the mother die 92.

Figure 5:
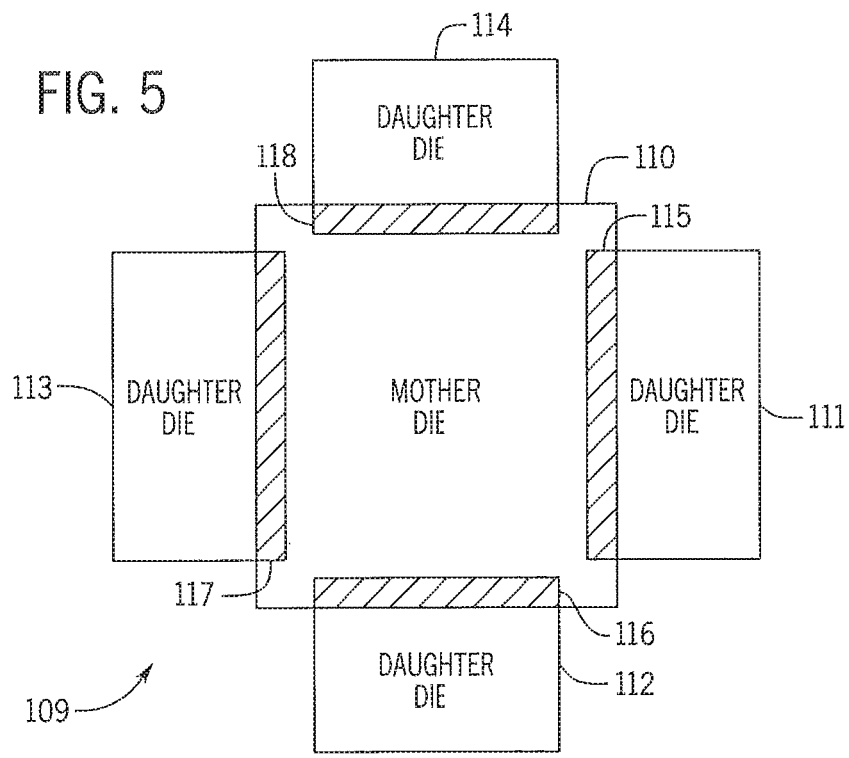
FIG. 5 is a block diagram illustrating a layout of the integrated circuit device package of FIG. 4, in accordance with an embodiment.

Although the IC device package 90 illustrates only two daughter die 94, 96, as many daughter die may be interfaced with the mother die 92 as space available on an edge of the mother die 92 may allow. For example, FIG. 5 illustrates a layout 109 that includes a mother die 110 with daughter die 111, 112, 113, and 114 coupled to the mother die 110 on each side of the mother die 110. Specifically, the daughter die 111, 112, 113, and 114 couple to the mother die 110 in overlap regions 115, 116, 117, and 118, respectively. Micro bumps of the mother die 110 of a respective daughter die may interface with micro bumps of the respective daughter die in a respective overlap region between the mother die 110 and the respective daughter die. For example, the daughter die 111 may couple to the mother die 110 using micro bumps of the daughter die 111 and the mother die 110 that interface in the overlap region 115. In another example, the mother die 110 may be connected to the daughter die 111 using a microvia in the substrate 102.

Figure 6:
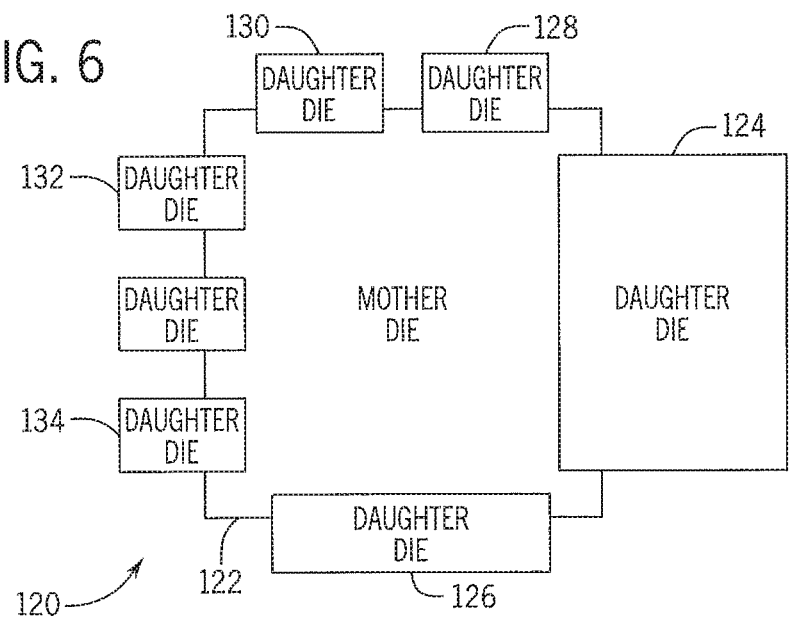
FIG. 6 is a block diagram illustrating a layout of the integrated circuit device package of FIG. 4, in accordance with an embodiment.

Moreover, attached daughter die may differ in size and/or function from other daughter die. For example, FIG. 6 illustrates a layout 120 with a mother die 122. The mother die 122 may include a CPU, a programmable device [e.g., field-programmable gate array (FPGA]), or some other circuitry. The mother die 122 is coupled to a large daughter die 124. The large daughter die 124 may include a programmable device (e.g., FPGA) that may interface with the mother die 122. The mother die 122 may also couple with other daughter die 126, 128, 130, 132, and 134 having various other shapes and sizes that each overlap with and interface with the mother die 122. The daughter die 126, 128, 130, 132, and 134 may include any suitable circuitry, such as amplifiers, multiplexing, sensing, logic gates, timers, voltage regulators, motor controllers, microcontrollers, microprocessors, FPGAs, and other circuitry.

Figure 7:
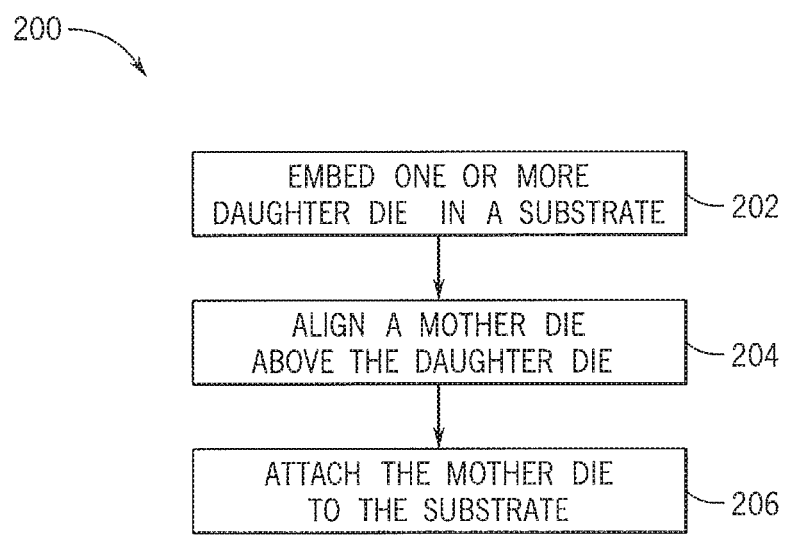
FIG. 7 is a flow diagram of a process for forming the integrated circuit device package of FIG. 4, in accordance with an embodiment.

FIG. 7 illustrates a process 200 for fabricating an integrated circuit (IC) device. The process 200 includes embedding one or more daughter die into a substrate of the integrated circuit device (block 202). As previously noted, the one or more daughter die and/or the mother die 92 may include an any suitable circuitry, such as amplifiers, multiplexing, sensing, logic gates, timers, voltage regulators, motor controllers, microcontrollers, microprocessors, FPGAs, and other circuitry. Moreover, the one or more daughter die may be located in the substrate such that the one or more daughter die are coplanar. The coplanar aspect of daughter die may include a body of the one or more daughter die or micro bumps of the one or more daughter die or both. For example, if the micro bumps of all of the one or more daughter die are equal in length, a top surface (closer to the mother die 92) of the one or more daughter die may be coplanar while each tip of each micro bump may also be coplanar. However, if the lengths of the micro bumps of the one or more daughter die are not equal in length, either the tips of the micro bumps or the top surfaces of the one or more daughter die may be coplanar. Additionally or alternatively, at least one of the one or more daughter die may be located outside a plane defined by the remaining one or more daughter die. For example, such arrangements may be made to accommodate differences in micro bump lengths of the mother die 92 or other considerations to ensure connectivity between micro bumps of the mother die 92 and respective micro bumps of the one or more daughter die.

Aligning the mother die 92 with the one or more daughter die includes overlapping a portion of the mother die 92 with each of the one or more daughter die. The one or more daughter die each have an overlapping portion that is partially under the mother die 92 and a remaining extending portion that extends out from under the mother die. This extending portion of each of the one or more daughter die provides a point of access to a respective one or more daughter die. Using this point of access, routing may be formed in the substrate to provide access to the extending portion of each of the one or more daughter die, and, thus, to internal circuitry of the respective one or more daughter die.

The process 200 continues with aligning the mother die 92 vertically above the one or more daughter die by interfacing micro bumps of the mother die 92 with respective micro bumps of the one or more daughter die (block 204). This alignment provides interfacing between the mother die 92 and each of the one or more daughter die using micro bumps of the mother die 92 and micro bumps of each of the one or more daughter die. The mother die 92 and the daughter die can be connection with a microvia between the mother die and the one or more daughter dies. The interface between the mother die 92 and each daughter die provides a direct down connection (e.g., without through-silicon via) that includes a high-density connection.

Once the mother die 92 is aligned with the one or more daughter die, the mother die 92 is attached to the substrate (block 206). For example, the mother die 92 may be attached to the substrate using underfill and/or solder. Furthermore, the attachment may include an electrical connection to or through the substrate. Bonding out mechanisms (e.g., solder balls) provide an access point for various circuitries in the mother die 92 and/or in various die of the one or more daughter die. For example, solder balls may be arranged in a ball grid array with each ball providing a connection point to circuitry that is located within the mother die or one of the one or more daughter die. In addition or alternatively to the ball grid array, the integrated circuit device may include other types of packaging, such as through-hole packaging, surface mounting packaging, chip carrier packaging, pin grid array packaging, land grid array packaging, flat packaging, and/or other suitable packaging types.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit device package, comprising:
   a substrate;
   a first die coupled to the substrate having:
      internal circuitry; and
      a plurality of first die micro bumps that provide electrical connection to the internal circuitry from outside the first die; and
   a second die embedded in the substrate and having:
      a plurality of second die micro bumps, wherein a first set of first die micro bumps interfaces with a first set of second die micro bumps to provide a direct down connection through the substrate and between the first die and the second die.

2. The integrated circuit device package of claim 1, wherein the first die comprises a central processing unit and the second die comprises a programmable logic device.

3. The integrated circuit device package of claim 2, wherein the programmable logic device comprises a field programmable gate array.

4. The integrated circuit device package of claim 1, wherein the first die comprises a programmable logic device.

5. The integrated circuit device package of claim 4, wherein the programmable logic device comprises a field programmable gate array.

6. The integrated circuit device package of claim 1, wherein the first die overlaps the second die in a vertical direction.

7. The integrated circuit device package of claim 6, wherein the first die extends beyond an edge of the second die in a horizontal direction.

8. The integrated circuit device package of claim 1, wherein the first die couples to the substrate using die bumps.

9. The integrated circuit device package of claim 1, comprising routing that provides accessibility of the second die through the substrate.

10. An integrated circuit device, comprising:
    one or more daughter die embedded in a substrate;
    a mother die that is vertically above the one or more daughter die and overlaps only a portion of each of the one or more daughter die in respective one or more overlapping regions; and
    one or more interconnection paths through the substrate and between the mother die and the one or more daughter die with each interconnection path occurring in the respective one or more overlapping regions.

11. The integrated circuit device of claim 10, comprising routing that provides accessibility to at least one of the one or more daughter die through the substrate from outside the integrated circuit device.

12. The integrated circuit device of claim 10, wherein the portion of each of the one or more daughter die each comprises a micro bump area of the one or more daughter die that each includes one or more micro bumps that each provides connectivity to a respective one of the one or more daughter die from the mother die.

13. A method for packaging an integrated circuit device, comprising:
    embedding a daughter die in a substrate;
    aligning a mother die vertically above the daughter die with micro bumps of the daughter die interfacing with micro bumps of the mother die to establish a connection between the daughter die and the mother die; and
    attaching the mother die to the substrate, wherein the mother die has micro bumps that contact the substrate.

14. The method of claim 13, wherein embedding the daughter die comprises embedding one or more additional daughter die in the substrate, and wherein aligning the mother die with the daughter die comprises aligning the mother die with the one or more additional daughter die.

15. The method of claim 14, wherein the one or more additional daughter die are embedded coplanar with the daughter die.

16. The method of claim 13, wherein aligning the mother die with the daughter die comprises overlapping the mother die with an overlapping portion of the daughter die, wherein a remaining portion of the daughter die extends out from under the mother die.

17. The method of claim 16, comprising forming routing in the substrate to provide access to the remaining portion of the daughter die.

18. The method of claim 13, comprising coupling the mother die to the substrate using die bumps of the mother die.

19. The method of claim 14, comprising coupling the mother die to the daughter die using a microvia in the substrate.

20. An integrated circuit device, comprising:
one or more daughter die embedded in a substrate;
a mother die that is vertically above the one or more daughter die; and
one or more interconnection paths through the substrate and between the mother die and the one or more daughter die with each interconnection path occurring through a direct down connection, wherein the direct down connection does not comprise a through-silicon via (TSV).

* * * * *